Oct. 27, 1959 R. F. RUTZ 2,910,634

SEMICONDUCTOR DEVICE

Filed May 31, 1957

INVENTOR
RICHARD F. RUTZ

BY Alvin J. Riddles
AGENT

United States Patent Office 2,910,634

Patented Oct. 27, 1959

2,910,634

SEMICONDUCTOR DEVICE

Richard F. Rutz, Fishkill, N.Y., assignor to International Business Machines Corporation, New York, N.Y., a corporation of New York Application May 31, 1957, Serial No. 662,636

19 Claims. (Cl. 317—235)

This invention relates to semiconductor devices and in particular to electrode arrangements on semiconductor device bodies.

In order to provide a semiconductor device capable of performing complex logical operations it has been necessary to provide a plurality of input and output terminals to the same semiconductor crystal all within a sufficiently short distance of each other to permit transistor action. This type of construction leads to difficult fabrication problems and has imposed a practical limitation on the size and complexity of such logical devices where no theoretical limitation exists. An example of a semiconductor device capable of performing such complex logical functions is described in copending application Ser. No. 645,627, filed March 12, 1957, which is a continuation of application Serial No. 511,047, filed May 15, 1955, now abandoned, and assigned to the assignee of this application.

What has been discovered is a structural principle useful in semiconductor device fabrication wherein an unlimited number of inputs and outputs may be placed in operative association with a semiconductor crystal in sufficient proximity to each other for transistor action.

A primary object of this invention is to provide a semiconductor structural principle wherein a multiplicity of input and output electrodes may be applied to the same base, all within a distance sufficient for transistor action with respect to each other.

Another object is to provide a remote emitter semiconductor device.

Another object is to provide a multiple emitter semiconductor device.

Still another object is to provide a multiple collector semiconductor device.

Still another object is to provide a semiconductor device having multiple inputs and multiple outputs.

Still another object is to provide a semiconductor device having a number of input terminals one of which is capable of influencing the performance of the others.

Other objects of the invention will be pointed out in the following description and claims and illustrated in the accompanying drawings, which disclose, by way of example, the principle of the invention and the best mode, which has been contemplated, of applying that principle.

These and other objects are achieved in this invention by providing a structure wherein a base region is provided having a thickness within the diffusion length of the average carrier during the carrier lifetime of the semiconductor crystal and applying to one side of that base region a broad area rectifying contact and, to the other side of that base region, applying a number of input electrodes and a number of current amplifying output electrodes separated from each other by a distance at least as great as the thickness of the base region. This permits minority carriers injected by any one or all of a plurality of input electrodes to diffuse through the base region and be collected by the broad area rectifying contact and then to be re-emitted to the base region at a point within the diffusion distance of the output electrodes.

Figure 1:
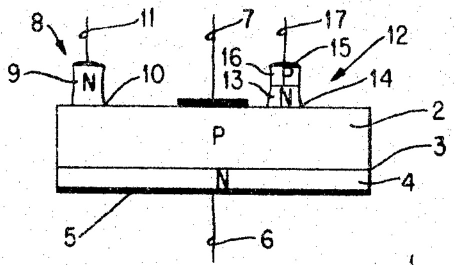
Fig. 1 is a schematic illustration of a semiconductor device illustrating the structural principle of this invention.

Referring now to Fig. 1, a semiconductor device 1 is shown comprising a semiconductor crystal 2 of P type material having a broad area rectifying contact shown as a PN junction 3 and N region 4 covering an entire major surface thereof. The N region 4 is essentially unipotential throughout. This may be achieved by resistivity control or as is illustrated here the region 4 is very thin and has its entire exposed surface covered by an ohmic contact 5 such as a coating of solder to which an electrical lead 6 may be attached. The thickness of the P region of the semiconductor crystal 2 is within the diffusion distance of the average carrier during the carrier lifetime of the particular material selected for the crystal 2. To the other large area surface of the crystal 2 a plurality of input and output contacts are made. An ohmic base connection 7 is shown made to the crystal 2 at the center of the structure. An emitter connection 8 is provided comprising an opposite conductivity type semiconductor region 9 forming a PN junction 10 with the P region 2, and, an ohmic external connection 11 is made to the N type region 9. A collector 12 is shown, comprising a PN hook well known in the art for current amplification purposes. It should be noted that any current amplifying connection known in the art and having the requisite amplification factor will serve as a collector in this invention. The collector 12 here illustrated includes an N region 13 forming a PN junction 14 with the P type crystal 2 and a P region 15 forming a PN junction 16 with the N region 13 and an external ohmic connection 17 is made to the P region 15.

In the structure of Fig. 1 assuming the potential level in the N region 4 to be in floating condition or not established at any particular level, minority carriers injected to the base region 2 from the emitter 8 at junction 10 will diffuse through the P region 2 to the barrier 3 within their carrier lifetime. The thickness dimension of the region 2 is maintained in construction to permit this. The N region 4 being unipotential throughout as for example being thin and being coated with a solder coating 5 and since its potential level is floating will adjust itself and be positive or negative according to the emitter current and will then re-emit an equivalent quantity of minority carriers from the junction 3 to the collector 12 from a region of the junction 3 in the vicinity of the collector. Thus it may be seen that the positioning of the emitter 8, and the collector 12 with respect to each other for transistor action is now no longer critical and that a multiplicity of emitters may be applied to the surface of region 2 so long as their distance from any one of any number of collectors such as 12 is greater than the distance of the thickness of the P region 2.

A major advantage of this structure is that all input impedances at the emitters will be positive as opposed to a negative input impedance such as may occur where a high amplification factor collectors are provided in a semiconductor device. This may be seen by considering the structure of this invention as follows: The emitter 8 can be considered in this illustration as the input of a grounded or reference base 2, NPN type transistor, the collector of which is the floating region 4. It is well known in the art that grounded base amplifiers are stable and have positive input impedances. In turn the floating N region 4 also serves as the emitter for a grounded base current amplifying type collector transistor comprising emitter region 4, base region 2 and collector 12. Furthermore, if the emitters themselves are placed more than a diffusion length apart almost complete electrical isolation of the inputs is achieved and since this type of performance is achieved in a single structure a considerable increase in response is realized.

For purposes of symmetry of majority carrier flow within the crystal between collector and base, the ohmic contact 7 of the region 2 is shown in the center of the region 2 between the emitter 8 and collector 12 electrodes. This feature is of considerable advantage in that it gives isolation between emitter and collector providing thereby shielding, and a reduction in possibility of surface short circuits between electrodes and further appreciably reducing minority carrier storage in the P region 2 since smaller physical crystal sizes may be used. This construction also provides minimum base resistance with a given physical volume of crystal.

It will be apparent to one skilled in the art that the structural principle illustrated in Figure 1 and described above permits the fabrication of a semiconductor device which may have any number of any type of emitter and current amplifying collector electrodes known in the art operatively associated with it and as a result the structural principle lends itself to the fabrication of involved devices capable of achieving highly complex logical functions. An example of one such complex logical function will be described in detail later.

A further advantage rests in the fact that the broad area, unipotential, rectifying contact shown as barrier 3, region 4 and coating 5 may be connected to serve as a separate input terminal for overriding signals and inhibiting signals introduced at an emitter such as 8 and it also serves as a collector for minority carriers which delay recovery time. The ohmic base connection 7 positioned between the emitter and collector electrodes permits the majority carrier flow from collector to base to set up a field in the region 2 that is operative to restrict the area of minority carrier injection from the barrier 3 to a small area in the vicinity of the collector.

Reference is here made to copending application Serial No. 458,619, filed September 14, 1954, assigned to the same assignee as this application and which discloses related subject matter.

The structure of this invention may be fabricated in a variety of ways that are standard in the art. A preferred manner of constructing the device is as follows.

The body of the device may be provided by a diffusion operation such as the technique of gaseous or vapor diffusion wherein a quantity of a particular conductivity type monocrystalline semiconductor material is exposed to an environment containing opposite conductivity type directing impurities so that the exposed surface of the quantity of semiconductor material, to a predetermined depth, may be converted to the conductivity type of the impurities present in the environment.

Figure 2:
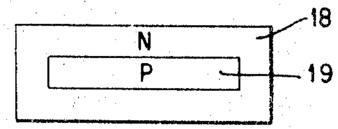
Fig. 2 is a semiconductor crystal wafer into which have been diffused opposite conductivity type directing impurities.

Referring now to Figure 2 a quantity of monocrystalline semiconductor material 18 is shown after the above described diffusion operation. The material 18 has a region 19 of original conductivity type, and a region from the entire surface to a predetermined depth, of opposite conductivity type, shown as N. The quantity of material 18 may be used in a manner to be later explained to fabricate a wide variety of semiconductor devices each with desirable characteristics not heretofore readily available in the art.

Figure 3:
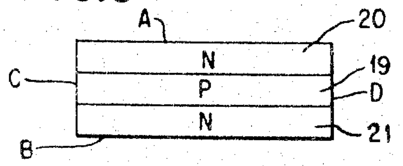
Fig. 3 is the wafer of Fig. 2 having the ends removed.

The quantity of material 18 may now be cut so that the ends are removed and a "sandwich" of material having regions of alternately opposite conductivity is achieved. Such a "sandwich" is shown in Figure 3 as made up of regions of N, P and N conductivity types labeled regions 20, 19 and 21 respectively. In the interest of clarity a certain amount of liberty has been taken with the scale of the figures under description. In order to establish proper perspective a typical example of an N–P–N sandwich as shown in Figure 3 is approximately 0.015 inch from surface A to surface B and approximately one inch from edge C to edge D. A convenient way of providing the material 18 for conversion to the sandwich is to cut a wafer from a grown monocrystalline ingot so that it may be seen that the sandwich of Fig. 3 may be several square inches in area on surfaces A and B. For optimum device performance it will be advantageous to cut the major surfaces A and B parallel to the (111) crystallographic plane of the ingot. The size of surfaces C and D and hence the thickness of the wafer is governed mainly by the time required for diffusion. The diffusion process is relatively slow and hence the wafer is usually quite thin.

A sandwich of the above described type may be prepared by exposing a 1 ohm centimeter P type wafer .015 inch thick to a vapor of arsenic having a concentration of $2\times10^{17}$ molecules per milliliter in a reducing atmosphere of 14.7 in. Hg. at 800° centigrade for approximately 48 hours.

It will be apparent to one skilled in the art that from the above discussion and example, "sandwiches" of any combination of conductivities and any variation of resistivities may be fabricated, and, that since the sandwiches may have a relatively large area in square inches, many relatively small, approximately $.4\times10^{-3}$ square inches in area dice, may be cut therefrom to provide a large number of semiconductor devices.

Figure 4:
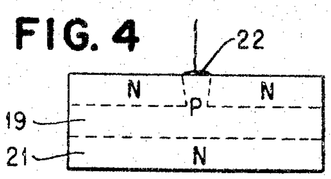
Fig. 4 is intermediate product illustrating the application of a base contact to the device of Fig. 1.

Considering next Figure 4, an ohmic contact is shown made to the P type center zone 19 of the NPN sandwich. This is accomplished by placing a quantity of material including the desired impurity, capable of forming a low melting point alloy with the material of the semiconductor sample and heating. In the presence of heat the alloy temperature of the semiconductor material-alloy material is reached and on subsequent cooling a region of semiconductor material recrystallizes out of the alloy in which is contained sufficient conductivity directing impurities to predominate. The alloy serves as an ohmic contact to this region. The depth of penetration of the alloy material into the semiconductor material is regulated by the quantity of alloy material applied, the wetted surface area, and the temperature and duration of the temperature cycle. A discussion of this phase of the technique may be found in the following reference: "Calculations of Alloying Depth of Indium in Germanium" by Louis Pensak in Transistors I, published by R. C. A. Laboratories, Princeton, New Jersey, pages 112 to 120.

In Figure 4 a quantity of alloy material 22 such as indium is shown applied to a surface of the N region 20 and the material has been subjected to a heat cycle sufficient to cause the indium to form an alloy and penetrate through the N region 20 into the P region 19. Since the region 19 is P type and the indium 22 is also a P type impurity the recrystallized region will be of the same conductivity type as the region 19 and will serve as an ohmic contact thereto. In a particular example a 0.015 inch diameter indium sphere penetrated through the N region 20 and formed an ohmic contact 22 with the P region 19 when heated at 700° centigrade for 30 minutes.

Figure 5:
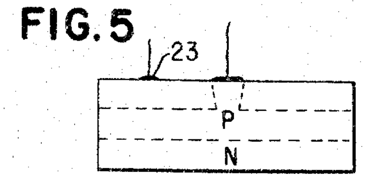
Fig. 5 is a schematic illustration of the application of an emitter contact to the device of Fig. 1.

In Figure 5 a soldering operation is illustrated showing the formation of an ohmic contact suitable for the emitter of the transistor of Fig. 1. In this illustration a quantity of material 23 such as solder is applied under controlled conditions so that the depth of penetration is not completely through the N region 20 and an ohmic contact is provided. In a particular example, a sphere of solder .005 inch in diameter penetrated .002 inch into the N region 20 forming the ohmic contact 23 when heated at 700° centigrade for five minutes.

Figure 6:
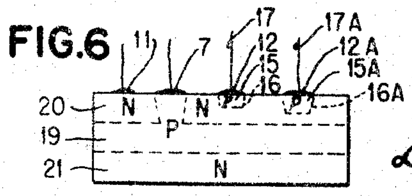
Fig. 6 is a schematic illustration of the application of collector contacts to the device of Fig. 1.

In Figure 6, a second alloying operation is illustrated showing the formation of the PN hook collector 12 of Figure 1. In this illustration a quantity of material 24 including the desired impurity is alloyed under controlled conditions so that the depth of penetration is not completely through the N region 20 and a rectifying contact is provided. In Figure 6, the formation of two PN hook type collectors 12 and 12A are illustrated wherein the controlled alloying results in the conversion of a portion of the N region 20 to a P region 15 and 15A each forming rectifying barriers 16 and 16A with the N region 20. In a particular example, a sphere of indium .005 inch in diameter penetrated .002 inch into the N region 20 forming the P region 15 and barrier 16 when heated at 700° centigrade for five minutes. Through variation of alloying times different thicknesses of N region 20 may be acquired so that the intrinsic amplification factor of the "PN Hook" collector may be controlled.

Figure 7:
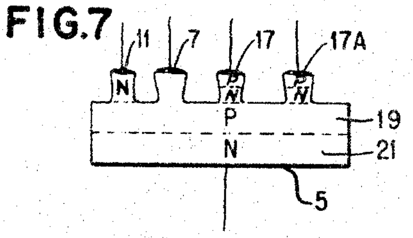
Fig. 7 is an illustration of an etching operation used to separate the input and output electrodes of the device of Fig. 1.

The intermediate product of Figure 6 comprising a "sandwich" having ohmic, current amplifying and rectifying contacts made to the respective regions may be converted into a semiconductor device by isolating the contacts and attaching electrical connections thereto. A method of isolating the contacts is shown in Figure 7 wherein a removal step is employed to take away unused portions of region 20. A preferred method of accomplishing this removal is by etching away either by chemical or electrolytic means the desired material. Other means such as sandblasting and conversion of the unwanted material to high resistivity may be used to accomplish the same purpose as etching. Referring now to Figure 7, a device is shown with the unwanted portions of region 20 being removed. In a particular example considering germanium semiconductor material at room temperature, an electrolytic etching operation carried out in an aqueous solution of potassium hydroxide (5% KOH) using 40 milliamperes of current will etch through a region, such as N region 20 approximately .005 inch thick in approximately two minutes. The reverse breakdown characteristic between each electrode and the base electrode will give a measure of completion of the isolation. The rate of reaction between the etching operation selected and the alloy material of contacts such as 11, 7 and 17 should be less than the rate of reaction between the etching operation and the semiconductor material. It will be apparent that under conditions such as those shown under contacts 11 and 17 there will be some undercutting of the part of the N region 20 under the contacts due to the action of the etching operation on the sides of the region. This has not been found to be appreciable and is best controlled by making the diameter of the contact of a type such as 11 or 17 so large that the undercutting in the time needed to etch away the unwanted portions of the region such as 20 will be insignificant.

Electrical connections may now be applied to contacts 7, 11 and 17 and a solder coating 5 may be applied to region 21 of the product shown in Figure 7. This will result in a transistor of the type described in connection with Figure 1 except that the transistor of Fig. 7 will have two current amplifying collectors.

Figures 8, 9:
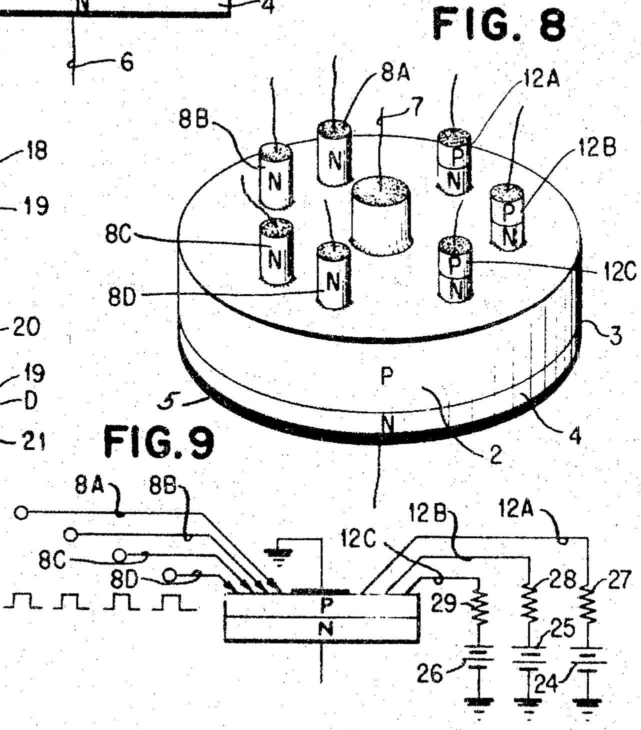
Fig. 8 is a perspective view of an illustration of multiple input and output semiconductor devices applying the structural principle of this invention.
Fig. 9 is an illustrative circuit using the device of Fig. 8.

The structural principle of this invention may be employed in the fabrication of complex semiconductor devices. An example of such a device is shown in Figure 8 wherein a four input, three output semiconductor device is shown having four emitters 8A, 8B, 8C and 8D and three collectors 12A, 12B and 12C all in operative relationship with the body 2 and a broad area unipotential rectifying contact is made to the side of the body 2 opposite to the emitters and collectors, this rectifying contact is shown in Figure 8 as being made up of a region of opposite conductivity type 4 separated from the body 2 by a PN junction 3 and a solder coating 5 to which an external lead 6 has been attached. It should be noted that in using the method of fabrication described above, the regions 19 and 21 have become regions 2 and 4 respectively of the device of Figure 8.

Through the proper positioning of the current amplifying type collectors 12A, 12B and 12C in the manner described in the above recited copending application Serial No. 645,627 these collectors can be made to operate in such a manner that initiation of conduction in one operates to extinguish conductor in another so that with an increasing amount of current in the base region 2 conduction may be caused to step from one collector to another cutting off the previous one.

A circuit for the utilization of the device of Figure 8 is shown in Figure 9. In this figure input signals are shown as being applied to emitters 8A, 8B, 8C and 8D, terminal 6 is shown as being permitted to seek its own potential level and collectors 12A, 12B and 12C are shown as being returned to power and bias sources 24, 25 and 26 respectively through loads shown as impedances 27, 28 and 29, respectively each selected so as to produce saturation in a particular collector for a particular value of emitter current.

In order to aid in comprehending the logical potentialities of such a device, a particular example is here illustrated wherein the values of resistors 27, 28 and 29 are so selected that saturation in collector 12A takes place at slightly more than 1 increment of input current, saturation in collector 2 takes place at slightly more than 2 increments and saturation in collector 3 takes place at an input current value slightly more than 3 increments. As an example, consider each increment equal to one milliampere. Each input signal to the emitters 8A, 8B, 8C and 8D is considered to be 1 increment.

In this circuit, one increment of input current injected in the form of minority carriers at emitter 8A diffuses to the junction 3 through the controlled thickness of region 2 and is re-emitted from the junction 3 at collector 12A thereby initiating conduction in that collector. The manner of selecting a particular collector to be favored for a given magnitude of current is a matter related to proximity to the junction 3 or to the intrinsic amplification factor of the collector or both and is explained in detail in the above recited copending application Serial No. 645,627.

Figure 10:
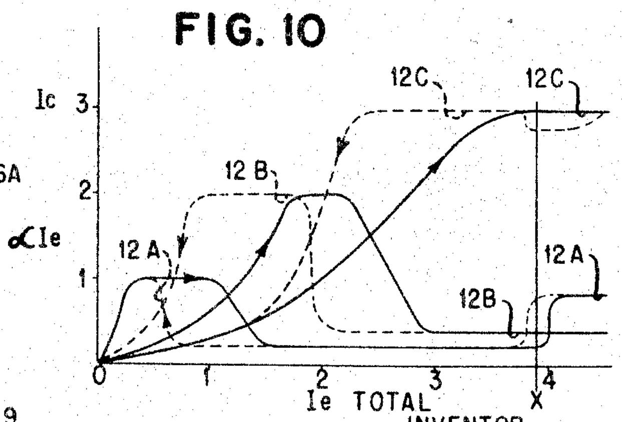
Fig. 10 is a graph of collector current with respect to emitter current for the circuit of Fig. 9.

The operation is graphically illustrated in Figure 10 showing an example of the collector characteristic curves of the circuit of Figure 9 for this illustration. The scale of the collector current is shown as $\alpha Ie$ and is in reality $\alpha$ effective$\times Ie$ where $\alpha$ effective is $$\frac{\alpha}{1+\frac{R^1}{R_c}}$$

where $R_1$=load resistance and $R_c$=dynamic collector resistance so that for each increment of current introduced at an emitter, $\alpha$ times that increment flows in the collector conducting. Each collector in this illustration involving P type base material, is current amplifying, that is, having an intrinsic $\alpha$ of $$1+\frac{1}{b}$$

where $b$ is the ratio of electron mobilities in the base region. Referring now to Figs. 9 and 10, the above described increment applied at any emitter, for example, at emitter 8A turns on collector 12A. A second increment introduced at another emitter, for example, 8B provides an increment of current increase at the collectors by the above described mechanism and due to the construction of the collectors, and their respective load impedances, collector 12A goes into saturation, the excess carriers turn on collector 12B which being a stronger collector "robs" all the current from collector 12A essentially shutting it off. This is shown in Figure 10 by the fact that the collector current curve for collector 12A goes to a very low value at 2 increments of emitter current whereas collector 12B goes to a higher value determined by the magnitude of resistor 28. The application of a third increment of input current, for example, through emitter 8C is effective as before through the re-emission mechanism described above to provide more current at the collectors. Since load 28 was selected to saturate collector 12B at slightly more than two increments of current, the effect of this, as may be seen in Fig. 10, is to shut off collector 12B and turn on collector 12C resulting in a heavy current in collector 12C and collectors 12A and 12B being effectively turned off.

Introduction of a further increment at, for example 8D, drives 12C into saturation and the excess turns on the initially favored collector 12A again. It will be apparent that, by virtue of the structural principle of this invention, many more emitter and current amplifying collector connections than have been illustrated may be provided and these connections may be of any type used in the art. It will be apparent that, referring to Figure 10, that the return characteristic curves for each collector, shown dotted, do not follow the same path as $Ie$ is reduced that they followed as $Ie$ was increased and that the area within the two paths is indicative of the storage of information. Consider for example, collector 12A in the region $Ie=X$. In this condition the addition of approximately 0.25 increment of $Ie$ places the collector in a high energy state which is retained after the input signal increment is removed. The information may be read out by reducing the input current by approximately 0.25 increment and the resultant output is amplified by the amplification factor of the transistor. Similar examples of storage areas are present to varying degrees in the characteristic curves of the other collectors 12B and 12C. The shape and size of the areas may be controlled by the construction of the collectors as described in the above referred to copending application Serial No. 645,627. The storage areas indicate more than one stable state in individual collectors and strongly resemble hysteresis loops.

As a further illustration of the logical potentialities of the circuit of Figure 9 consider the Truth Table below prepared considering only the positive going portions of the curves of Figure 10.

*Table 1*

| $p$ | $q$ | $r$ | $s$ | $f_1$ | $f_2$ | $f_3$ | |
|---|---|---|---|---|---|---|---|
| 1 | 1 | 1 | 1 | 1 | 0 | 1 | A |
| 1 | 0 | 1 | 1 | 0 | 0 | 1 | B |
| 1 | 1 | 0 | 1 | 0 | 0 | 1 | C |
| 1 | 0 | 0 | 1 | 0 | 1 | 0 | D |
| 1 | 1 | 1 | 0 | 0 | 0 | 1 | E |
| 1 | 0 | 1 | 0 | 0 | 1 | 0 | F |
| 1 | 1 | 0 | 0 | 0 | 1 | 0 | G |
| 1 | 0 | 0 | 0 | 1 | 0 | 0 | H |
| 0 | 1 | 1 | 1 | 0 | 0 | 1 | I |
| 0 | 0 | 1 | 1 | 0 | 1 | 0 | J |
| 0 | 1 | 0 | 1 | 0 | 1 | 0 | K |
| 0 | 0 | 0 | 1 | 1 | 0 | 0 | L |
| 0 | 1 | 1 | 0 | 0 | 1 | 0 | M |
| 0 | 0 | 1 | 0 | 1 | 0 | 0 | N |
| 0 | 1 | 0 | 0 | 1 | 0 | 0 | O |
| 0 | 0 | 0 | 0 | 0 | 0 | 0 | P |

Assuming that emitters 8A, 8B, 8C and 8D of the device of Figure 8 are assigned the variable notations $p$, $q$, $r$ and $s$ respectively it will be apparent that the device at its outputs 12A, 12B and 12C is capable of achieving the logical functions $f_1$, $f_2$ and $f_3$, respectively. As is described in copending application Serial No. 611,922, filed September 25, 1956, and assigned to the assignee of this application, these functions are full operators of the "quaternary" or four variable information system and since operators of this degree of complexity can be realized directly it is possible through assignment of fixed signals to certain of the input terminals 8A through 8D to achieve a multiplicity of functions of lesser order input information systems such as ternary, binary and singulary. For a simple limited example, referring to Table 1, consider fixed assignment of 1 given to $p$ and to $s$ and consider $q$ and $r$ to be variables. In the conditions described by lines A, B, C and D of the table, $f_1$ describes the binary logical operator "And" symbolized ●; while $f_2$ describes the binary logical operator "Neither nor" symbolized ↓ which is also referred to by the Boolean algebra notation of "And not"; and at the same time at $f_3$ describes the binary logical function "Or," symbolized V.

It will be apparent that a device using the structural principle of this invention is capable of realizing many varied and complex logical relationships in information processing.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. For example, it will be apparent that the emitters may be provided with a region of opposite conductivity so that a given reverse breakdown is achieved; hence, under some conditions emitters and collectors will be interchangeable. It is the intention therefore, to be limited only as indicated by the scope of the following claims.

What is claimed is:

1. A semiconductor device comprising in combination a semiconductor body of a particular conductivity type including first and second broad area surfaces separated by a thickness in the vicinity of the diffusion length of the average excess carrier during the carrier life time of the particular semiconductor material of said body, a broad area unipotential rectifying contact substantially covering said first broad area surface, at least one emitter connection operatively associated with said body on said second surface, at least one collector connection operatively associated with said second surface each spaced from said at least one emitter connection by a distance greater than said thickness and an ohmic connection to said body.

2. The semiconductor device of claim 1 wherein said at least one collector connection is a current amplifying connection.

3. The semiconductor device of claim 1 wherein said at least one emitter connection exhibits high input impedance up to a selected potential.

4. The semiconductor device of claim 1 wherein said emitter and collector connections are point contacts.

5. The semiconductor device of claim 1 wherein said collector connection includes at least two current amplifying type collector connections so spaced with respect to each other that initiation of conduction in one collector is operative to extinguish conduction in an adjacent collector.

6. A semiconductor device comprising in combination a semiconductor body including first and second regions of opposite conductivity type separated by a junction barrier said barrier being essentially parallel with and separated from surfaces of said first and second regions by a distance near the diffusion distance of the average excess carrier during the carrier life time of the particular semiconductor material of said body, a broad area ohmic contact covering substantially all of the surface of said first region, at least one emitter connection on the surface of and operatively associated with said second region, at least one collector connection on the surface and operatively associated with said second region spaced from said at least one emitter a distance greater than said distance to said barrier and an ohmic connection to said second region.

7. The semiconductor device of claim 6 wherein said at least one collector is a current amplifying connection.

8. The semiconductor device of claim 7 wherein said at least one collector includes at least two adjacent collectors so spaced that initiation of conduction in one is operative to extinguish conduction in an adjacent collector.

9. The semiconductor device of claim 8 wherein said at least one emitter exhibits high input impedance up to a selected potential.

10. The semiconductor device of claim 9 wherein said emitter and collector electrodes are point contacts.

11. A semiconductor device comprising a body of semiconductor material of a particular conductivity type having first and second broad area surfaces separated by a thickness near the diffusion length for the average excess carrier during the carrier lifetime of the particular semiconductor material of said body, a first broad area essentially unipotential rectifying contact on said first surface, a second rectifying contact on said second surface, first and second current amplifying contacts on said second surface spaced from said second rectifying contact a distance greater than said thickness, said first and second current amplifying contacts being further spaced with respect to each other such that initiation of conduction in said second contact is operative to extinguish conduction in said first contact, and an ohmic contact to said body.

12. The semiconductor device of claim 11 wherein said ohmic contact is positioned on said second surface between said second rectifying contact and said current amplifying contacts.

13. The semiconductor device of claim 11 wherein said second rectifying contact and said current amplifying contacts are point contacts.

14. A semiconductor device comprising a body of semiconductor material of a particular conductivity type having first and second broad area surfaces separated by a thickness near the diffusion distance of the average excess carrier during the carrier lifetime of the particular semiconductor material of said body, a first broad area connection making rectifying contact with said body on said first surface, a plurality of emitter connections making rectifying contact with said body on said second surface, a plurality of collector connections making current amplifying contact with said second surface spaced from said emitter connections a distance greater than said thickness, said current amplifying connections having progressively higher amplification factors and each being so spaced with respect to the remainder of said current amplifying connections that initiation of conduction in one of said multiplicity of current amplifying connections is operative to extinguish conduction in an adjacent current amplifying connection and an ohmic connection to said body.

15. The semiconductor device of claim 14 wherein said ohmic connection is positioned on said second surface between said emitter and said collector connections.

16. A semiconductor device comprising in combination a semiconductor body having first and second areas separated by a distance in the vicinity of the diffusion distance of the average carrier during the carrier lifetime of the material of said body, a unipotential rectifying contact substantially covering said first area, an ohmic connection to said body, at least one emitting electrode operatively associated with a first portion of said second area, at least two current amplifying collector connections one of which is favored for low values of emitter current the remaining current amplifying collector connections each having progressively greater amplification factors, said collectors being operatively associated with a second portion of said second area separated from said first portion by a distance greater than said diffusion distance and said collectors being so positioned with respect to each other that initiation of conduction in a subsequent collector is operative to extinguish conduction in an immediately adjacent collector, the current at each said collector being of more than one value for each value of input current and the particular value realized being dependent on whether said input current is increasing or decreasing.

17. A semiconductor device comprising a body of semiconductor material of a particular conductivity type, having first and second broad area surfaces separated by a thickness near the diffusion length for the average excess carrier during the carrier lifetime of the particular semiconductor material of said body, a broad area essentially unipotential rectifying contact on said first surface, at least one current amplifying contact on said second surface, the current of each said current amplifying contact exhibiting in a particular range of input current more than one value for each value of input current and the particular value exhibited being dependent on whether the input current is increasing or decreasing and means including said broad area rectifying contact for injecting input current in the vicinity of each said current amplifying contact.

18. A semiconductor device comprising a body of semiconductor material of a particular conductivity type, having first and second broad area surfaces separated by a thickness near the diffusion length for the average excess carrier during the carrier lifetime of the particular semiconductor material of said body, a broad area essentially unipotential rectifying contact on said first surface, a source including said broad area rectifying contact for introducing variable input current into said body, at least one current amplifying output on said second surface, the current of each said current amplifying output exhibiting in a particular input current range a first value for each value of input current as said input current is increasing and exhibiting a second value for each value of input current as said input current is decreasing.

19. A semiconductor device comprising a body of semiconductor material of a particular conductivity type, having first and second broad area surfaces separated by a thickness near the diffusion length for the average excess carrier during the carrier lifetime of the particular semiconductor material of said body, a broad area essentially unipotential rectifying contact on said first surface, a source of variable input current, means including said broad area rectifying contact for introducing said variable input current to said body, at least one current amplifying contact on said second surface, the current of each said current amplifying contact for a particular range of input current varying such that no appreciable change in output current for changes in input current is exhibited until a certain predetermined magnitude of departure from an input current operating point is applied in a first direction, at which magnitude a substantial change is realized and once said substantial change is realized no further substantial change in output current will occur until said predetermined magnitude of departure from said operating point is applied in a direction opposite to said first direction.

References Cited in the file of this patent

UNITED STATES PATENTS

| | | |
|---|---|---|
| 2,666,814 | Shockley | Jan. 19, 1954 |
| 2,754,431 | Johnson | July 10, 1956 |
| 2,795,744 | Kircher | June 11, 1957 |
| 2,801,347 | Dodge | July 30, 1957 |
| 2,801,348 | Pankove | July 30, 1957 |
| 2,847,583 | Hung | Aug. 12, 1958 |
| 2,859,286 | Kennedy | Nov. 4, 1958 |